United States Patent
Ho et al.

(10) Patent No.: US 12,125,828 B2
(45) Date of Patent: Oct. 22, 2024

(54) CARRYING SUBSTRATE, ELECTRONIC PACKAGE HAVING THE CARRYING SUBSTRATE, AND METHODS FOR MANUFACTURING THE SAME

(71) Applicant: SILICONWARE PRECISION INDUSTRIES CO., LTD., Taichung (TW)

(72) Inventors: Chi-Ching Ho, Taichung (TW); Bo-Hao Ma, Taichung (TW); Yu-Ting Xue, Taichung (TW); Ching-Hung Tseng, Taichung (TW); Guan-Hua Lu, Taichung (TW); Hong-Da Chang, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 0 days.

(21) Appl. No.: 18/464,855

(22) Filed: Sep. 11, 2023

(65) Prior Publication Data

US 2023/0420420 A1 Dec. 28, 2023

Related U.S. Application Data

(63) Continuation of application No. 16/554,779, filed on Aug. 29, 2019, now Pat. No. 11,923,337.

(30) Foreign Application Priority Data

May 3, 2019 (TW) .................................. 108115386
Jul. 29, 2019 (TW) .................................. 108126794

(51) Int. Cl.
*H01L 25/065* (2023.01)
*H01L 21/48* (2006.01)
(Continued)

(52) U.S. Cl.
CPC ........ *H01L 25/0657* (2013.01); *H01L 21/486* (2013.01); *H01L 21/4882* (2013.01);
(Continued)

(58) Field of Classification Search
CPC ............... H01L 25/0657; H01L 21/486; H01L 21/4882; H01L 21/563; H01L 23/3114; H01L 23/5226; H01L 24/13; H01L 2225/06541; H01L 24/16; H01L 2224/05644; H01L 25/0655; H01L 23/42; H01L 2224/04026; H01L 2224/131;
(Continued)

(56) References Cited

U.S. PATENT DOCUMENTS 9,865,570 B1 * 1/2018 England .................. H01L 24/17
2017/0294422 A1 * 10/2017 Solimando .......... H01L 23/3672

* cited by examiner

*Primary Examiner* — Mohammad A Rahman
(74) *Attorney, Agent, or Firm* — Studebaker & Brackett PC

(57) ABSTRACT

A method of manufacturing a carrying substrate is provided. At least one circuit component is disposed on a first circuit structure. An encapsulation layer is formed on the first circuit structure and encapsulates the circuit component. A second circuit structure is formed on the encapsulation layer and electrically connected to the circuit component. The circuit component is embedded in the encapsulation layer via an existing packaging process. Therefore, the routing area is increased, and a package substrate requiring a large size has a high yield and low manufacturing cost.

12 Claims, 7 Drawing Sheets

(51) Int. Cl.
*H01L 21/56* (2006.01)
*H01L 23/00* (2006.01)
*H01L 23/31* (2006.01)
*H01L 23/522* (2006.01)

(52) U.S. Cl.
CPC ........ *H01L 21/563* (2013.01); *H01L 23/3114* (2013.01); *H01L 23/5226* (2013.01); *H01L 24/13* (2013.01); *H01L 2225/06541* (2013.01)

(58) Field of Classification Search
CPC . H01L 2224/16227; H01L 2224/16237; H01L 2224/32225; H01L 2224/32245; H01L 2224/73204; H01L 2224/73253; H01L 2224/92125; H01L 2224/92225; H01L 2924/15311; H01L 2924/16251; H01L 23/3675; H01L 23/49811; H01L 23/5383; H01L 23/5385; H01L 23/49816; H01L 2224/97; H01L 23/145; H01L 23/49822; H01L 21/4857; H01L 23/49827; H01L 23/49838; H01L 25/042; H01L 25/072; H01L 25/0753; H01L 25/115; H01L 25/043; H01L 25/04; H01L 25/065; H01L 25/074; H01L 25/0756; H01L 25/117; H01L 2225/06503–06596; H01L 25/0652; H01L 25/071; H01L 25/112
See application file for complete search history.

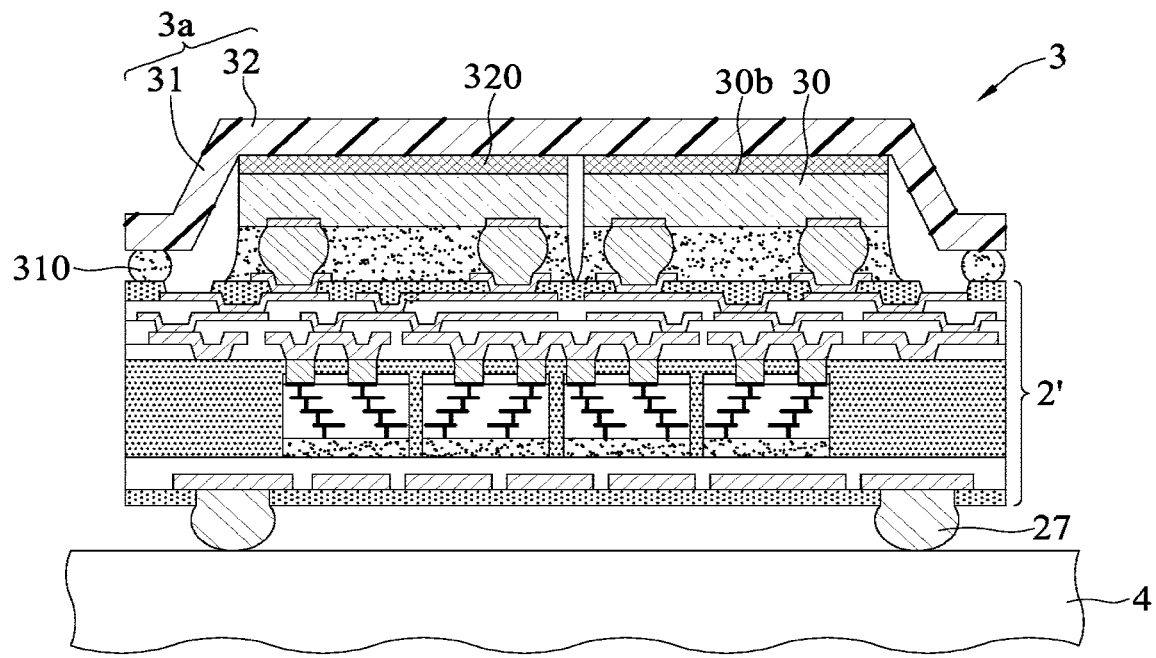
FIG. 2G'
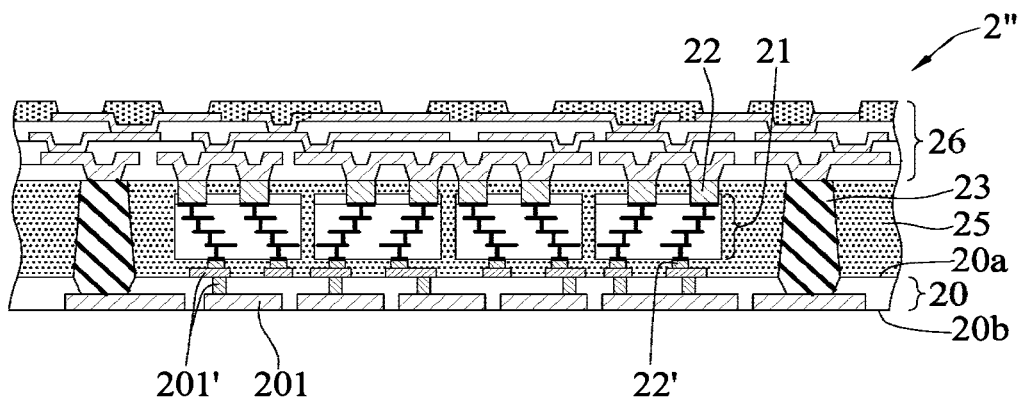
FIG. 2G"

CARRYING SUBSTRATE, ELECTRONIC PACKAGE HAVING THE CARRYING SUBSTRATE, AND METHODS FOR MANUFACTURING THE SAME

RELATED APPLICATIONS

This is a continuation of U.S. patent application Ser. No. 16/554,779, filed on Aug. 29, 2019, entitled "Carrying Substrate, Electronic Package Having the Carrying Substrate and Methods for Manufacturing the Same," which claims foreign priority to Taiwan Application Serial No. 108115386, filed on May 3, 2019, and Taiwan Application Serial No. 108126794, filed on Jul. 29, 2019. The entire contents of these applications are incorporated herein by reference for all purposes.

BACKGROUND

1. Technical Field

The present disclosure relates to package structures, and, more particularly, to a carrying substrate, an electronic package having the carrying substrate, and methods for manufacturing the same.

2. Description of the Prior Art

With the increasing demands for the functions and processing speed of an electronic product, a semiconductor chip, as a core component of the electronic product, has to have a high density of circuit components and electronic circuits. In operation, the semiconductor chip generates heat. The encapsulant that encapsulates the semiconductor chip has a coefficient of thermal conductivity of as low as 0.8 Wm-1k-1, and cannot dissipate the heat generated by the semiconductor chip efficiently. As a result, the semiconductor chip is likely to be damaged and a reliability problem is induced.

In order to dissipate heat efficiently, a heat sink or a heat spreader is disposed in the semiconductor package structure. The heat sink is bonded to a rear surface of a semiconductor chip via a heat dissipating compound, such as a thermal interface material (TIM), and the heat dissipating compound and the heat sink dissipate the heat generated by the semiconductor chip. The top surface of the heat sink is usually exposed from the encapsulant or to the atmosphere, to improve the heat dissipating effect.

As shown in FIG. 1, in a method for manufacturing a semiconductor package 1 according to the prior art, a semiconductor chip 11 is disposed on a package substrate 10 in a flip-chip manner with its active surface 11a disposed on the package substrate 10 (i.e. via conductive bumps 110 and an underfill 111); a top plate 130 of a heat sink 13 is reflowed and bonded to an inactive surface 11b of the semiconductor chip 11 via a TIM layer 12 (which includes a solder layer and a flux agent); and supporting legs 131 of the heat sink 13 are supported on the package substrate 10 via an adhesive layer 14. Then, a packaging molding process is performed, in which an encapsulant (not shown) encapsulates semiconductor chip 11 and the heat sink 13, with the top plate 130 of the heat sink 13 exposed from the encapsulant and contacting the atmosphere directly. The package substrate 10 of the semiconductor package 1 is then disposed on a circuit board 8 via a plurality of solder balls 15.

In operation, the semiconductor chip 11 generates heat, which will be conducted from the inactive surface 11b, through the TIM layer 12 and the top plate 130 of the heat sink 13, to an ambient outside of the semiconductor package 1.

With the development of industrial applications, research and development towards large-scale package specifications has been gradually applied to high-end products with high-density circuits/high transmission speed/high stacking number/large size design.

In the semiconductor package 1 according to the prior art, the package substrate 10 of a large size, such as 100*100 mm$^2$, still has a low yield, and has a high cost.

Therefore, how to solve the problems of the prior art is becoming an urgent issue in the art.

SUMMARY

In view of the drawbacks of the prior art, the present disclosure provides a carrying substrate, comprising: a first circuit structure having a first side and a second side opposing the first side; at least one circuit component disposed on the first side of the first circuit structure; and an encapsulation layer formed on the first side of the first circuit structure and encapsulating the circuit component.

The present disclosure also provides a method for manufacturing a carrying substrate, comprising: providing a first circuit structure having a first side and a second side opposing the first side; disposing at least one circuit component on the first side of the first circuit structure; forming an encapsulation layer on the first side of the first circuit structure, and encapsulating the circuit component with the encapsulation layer.

In an embodiment, the method further comprises forming a second circuit structure on the encapsulation layer, and electrically connecting the second circuit structure to the circuit component. In another embodiment, the circuit component is electrically connected to the second circuit structure via a plurality of conductive bodies. In yet another embodiment, the method further comprises disposing conductive pillars on the first side of the first circuit structure, encapsulating the conductive pillars with the encapsulation layer, and electrically connecting the conductive pillars to the first circuit structure and the second circuit structure. In still another embodiment, the method comprises forming a plurality of conductive bumps on the second circuit structure.

In an embodiment, the at least one circuit component comprises at least four circuit components, and the encapsulation layer encapsulates the at least four circuit components.

In an embodiment, the circuit component is a package substrate.

In an embodiment, the circuit component is a coreless circuit structure.

In an embodiment, the circuit component has a through silicon via structure.

In another embodiment, the circuit component is electrically connected to the first circuit structure via a plurality of conductive bodies.

The present disclosure further provides an electronic package, comprising the above-described carrying substrate and at least one electronic component disposed on one of the first side and the second side of the carrying substrate.

The present disclosure still provides a method for manufacturing an electronic package, comprising providing the above-described carrying substrate, and disposing at least one electronic component on one of the first side and the second side of the carrying substrate.

In an embodiment, the electronic component is an active element, a passive element, or a combination thereof.

In an embodiment, the method further comprises disposing a plurality of conductive elements on the other one of the first side and the second side of the carrying substrate that is without the electronic component.

In an embodiment, the method further comprises disposing a heat sink on the carrying substrate. In another embodiment, the heat sink is in contact with the electronic component.

It is known from the above that in the electronic package, the carrying substrate and the methods for manufacturing the same according to the present disclosure, the circuit component is disposed on the first circuit structure and embedded in the encapsulation layer. Therefore, the routing area is increased. Compared with the prior art, the present disclosure has a high yield and a low manufacturing cost, which is beneficial for demands of the package substrate with a large size and market competitiveness.

The circuit structures are used for allocating the number of routing layers of the circuit component, so as to reduce the number of the routing layers of the circuit component and increase the manufacturing yield of the circuit component.

BRIEF DESCRIPTION OF THE DRAWINGS

FIG. 2G' is a cross-sectional view of another aspect of FIG. 2G.

FIG. 2G'' is a cross-sectional view of another aspect of FIG. 2E.

DETAILED DESCRIPTION

The following illustrative embodiments are provided to illustrate the disclosure of the present disclosure, these and other advantages and effects can be apparently understood by those in the art after reading the disclosure of this specification.

It should be appreciated that the structures, proportions, size and the like of the figures in the present application are intended to be used in conjunction with the disclosure of the specification. They are not intended to limit the disclosure and therefore do not represent any substantial technical meanings. The details of the specification may be on the basis of different points and applications, and numerous modifications and variations can be devised without departing from the spirit of the present disclosure. As used herein, the terms "over," "first," "second," "a" and the like, are used to distinguish one element from another, and are not intended to limit the scope of the present application. Changes or adjustments are considered to be within the scope of the present disclosure, without departing from the scope of the present disclosure.

FIGS. 2A to 2E are cross-sectional views illustrating a method for manufacturing a carrying substrate 2 of a first embodiment according to the present disclosure.

Figure 1:
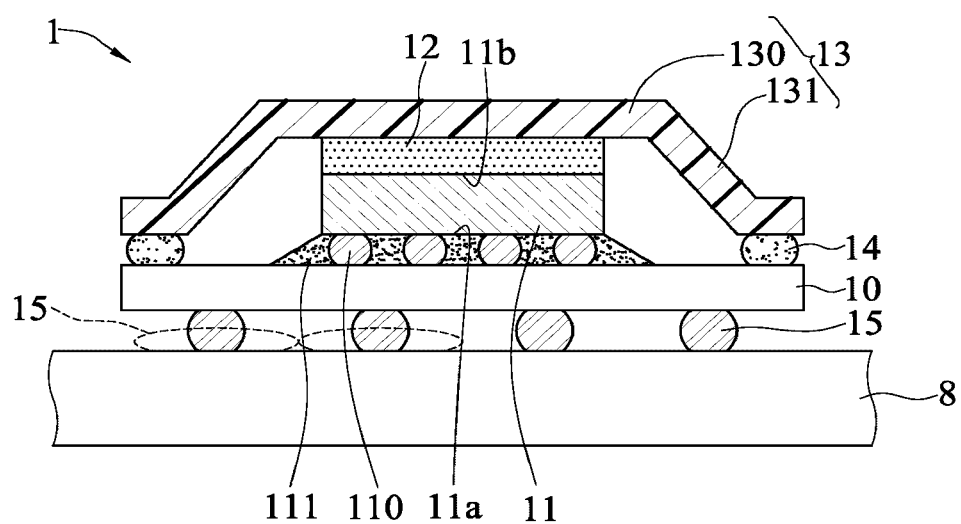
FIG. 1 is a cross-section view of a semiconductor package according to the prior art.
Figure 2A:
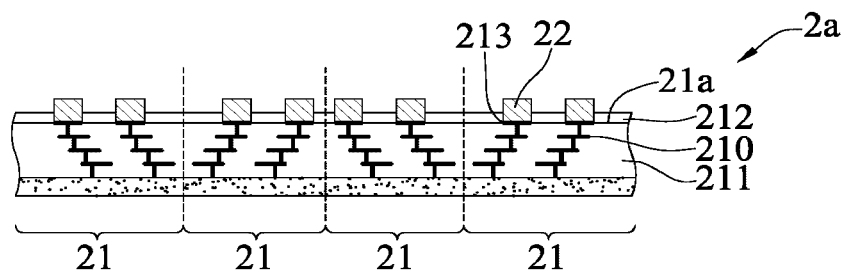
FIGS. 2A to 2E are cross-sectional views illustrating a method for manufacturing a carrying substrate of a first embodiment according to the present disclosure.

As shown in FIG. 2A, a circuit board 2a that includes a plurality of circuit components 21 is provided.

In an embodiment, the circuit component 21 is a package substrate having a core layer and a circuit structure, or a coreless circuit structure, which is shown in the drawing, and has an insulator 211 and a plurality of circuit layers 210, such as fan out redistribution layer (RDL) circuit layers, bonded to the insulator 211. In another embodiment, the insulator 211 is made of polybenzoxazole (PBO), polyimide (PI), prepreg (PP), or other dielectric materials. In yet another embodiment, the circuit component 21 has a through silicon via (TSV) structure. In still another embodiment, the circuit component 21 is a board for other arrangements of routings, such as an organic material, a semiconductor board (silicon), a ceramic board, or a carrier having metal routings.

In an embodiment, a plurality of conductive bodies 22 are disposed on and electrically connected to the circuit component 21. In another embodiment, the conductive bodies 22 are conductive circuits, and are in the shape of a round ball, such as a solder ball, in the shape of a pillar, such as a copper pillar or a solder bump, or in the shape of a stud fabricated by a solder wire machine. In an embodiment, a protection film 212, made of a passivation material, for example, is formed on a top surface 21a of the circuit component 21, a portion of the circuit layers 210 (e.g., a plurality of conductive pads 213) is exposed from the protection film 212, and the conductive bodies 22 are disposed on the conductive pads 213 and protrude from the protection film 212.

Figure 2B:
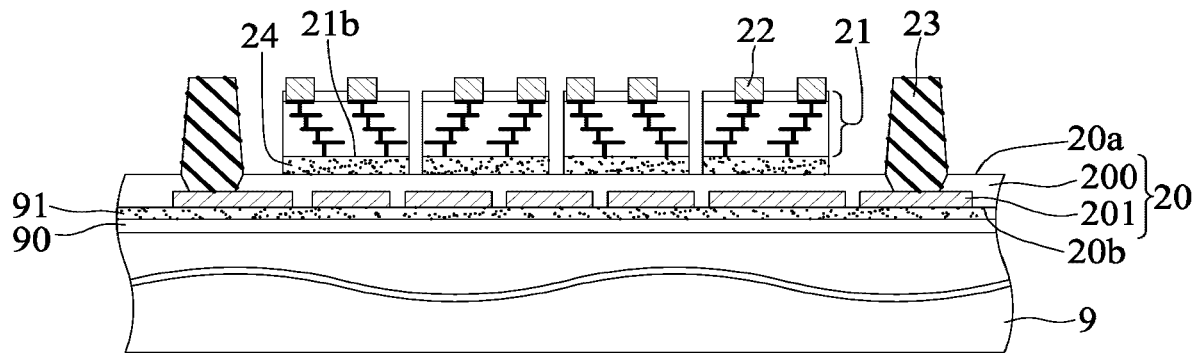

As shown in FIG. 2B, the circuit board 2a is cut to obtain a plurality of circuit components 21. One or a plurality of (e.g. at least four, as shown in the drawings) circuit components 21 are disposed on a first circuit structure 20. The first circuit structure 20 is disposed on a carrying board 9 and has a first side 20a and a second side 20b opposing the first side 20a. The second side 20b of the first circuit structure 20 is bonded to the carrying board 9. The circuit component 21 is disposed on the first side 20a of the first circuit structure 20. In an embodiment, a plurality of conductive pillars 23 are disposed on the first side 20a of the first circuit structure 20 and electrically connected to the first circuit structure 20. The circuit component 21 and the conductive pillars 23 can be disposed in any order on demands.

In an embodiment, the first circuit structure 20 comprises at least one first insulation layer 200 and a first RDL 201 formed on the first insulation layer 200. In another embodiment, the first RDL 201 is formed of copper, and the first insulation layer 200 is formed of PBO, PI, PP, or other dielectric materials.

In an embodiment, the carrying board 9 is a round board made of a semiconductor material, such as silicon and glass, and is covered thereon a release layer 90 and an adhesive layer 91 subsequently, for the first circuit structure 20 to be disposed on the adhesive layer 91.

In an embodiment, the conductive pillars 23 are disposed on and electrically connected to the first RDL 201. In another embodiment, the conductive pillars 23 are made of metal, such as copper, or a solder material.

In an embodiment, a bottom surface 21b of the circuit component 21 is adhered via a bonding layer 24, such as glue, to the first side 20a of the first circuit structure 20.

Figure 2C:
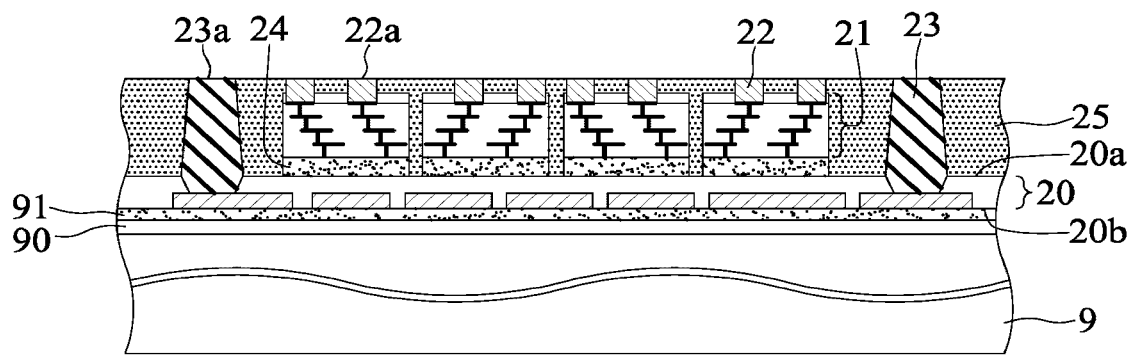

As shown in FIG. 2C, an encapsulation layer 25 is formed on the first side 20a of the first circuit structure 20 and encapsulates the circuit component 21, the bonding layer 24, the plurality of conductive bodies 22 and the plurality of conductive pillars 23. A leveling process is performed, allowing an end surface 23a of the conductive pillars 23 and an end surface 22a of the conductive bodies 22 to be exposed from the encapsulation layer 25 and flush with an outer surface of the encapsulation layer 25.

In an embodiment, the encapsulation layer 25 is made of an insulation material, such as a compound of epoxy resin, and is formed on the first side 20a of the first circuit structure 20 via lamination or molding.

In the leveling process, a portion of a material of the conductive pillars 23, a portion of a material of the conductive bodies 22 and a portion of a material of the encapsulation layer 25 are ground and removed.

Figure 2D:
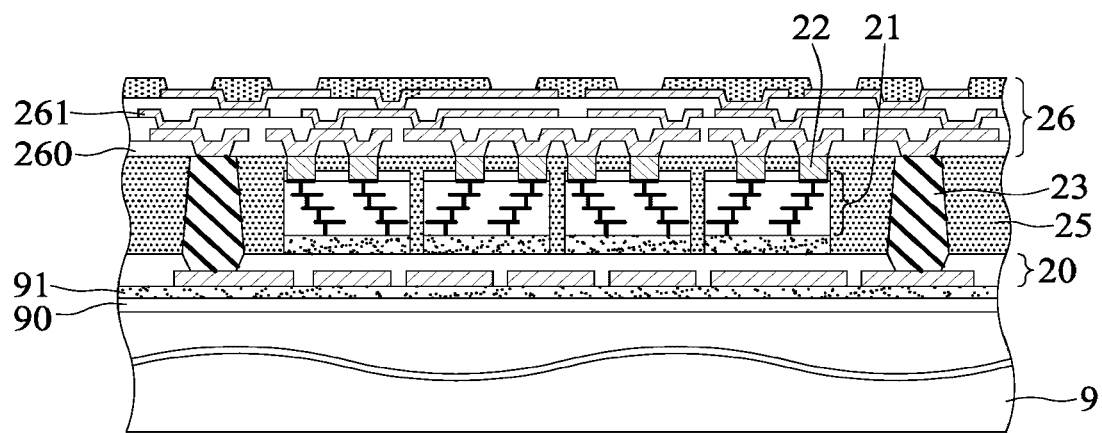

As shown in FIG. 2D, a second circuit structure 26 is disposed on the encapsulation layer 25 and electrically connected to the conductive pillars 23 and the conductive bodies 22.

In an embodiment, the second circuit structure 26 comprises a plurality of second insulation layers 260 and a plurality of second RDLs 261 formed on the second insulation layers 260. The outermost one of the second insulation layers 260 acts as a solder resist layer, and the outermost one of the second RDLs 261 is exposed from the solder resist layer. In an embodiment, the second circuit structure 26 comprises a single second insulation layer 260 and a single second RDL 261.

In an embodiment, the second RDLs 261 are made of copper, and the second insulation layers 260 are made of PBO, PI, PP or other dielectric materials.

Figure 2E:
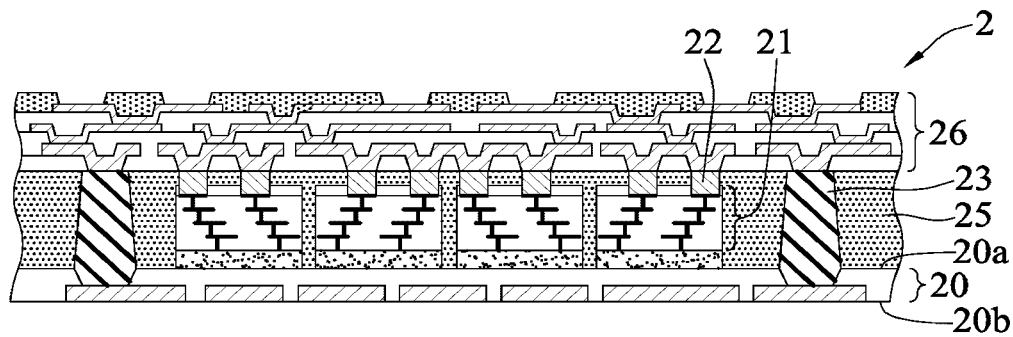

As shown in FIG. 2E, the carrying board 9 and the release layer 90 and the adhesive layer 91 thereon are removed, to expose the first circuit structure 20 and form the carrying substrate 2 according to the present disclosure.

In the method for manufacturing the carrying substrate 2 according to the present disclosure, the circuit component 21 is embedded in the encapsulation layer 25 during an existing packaging process, to increase the routing area. Compared with the prior art, the carrying substrate 2 according to the present disclosure has a high yield and a low manufacturing cost, which is beneficial for demands of package substrates of large size and market competitiveness.

The first circuit structure 20 (or the second circuit structure 26) is used for allocating the number of routing layers of the circuit component 21, to reduce the number of the routing layers of the circuit component 21 and increase the manufacturing yield of the circuit component 21.

Figure 2F:
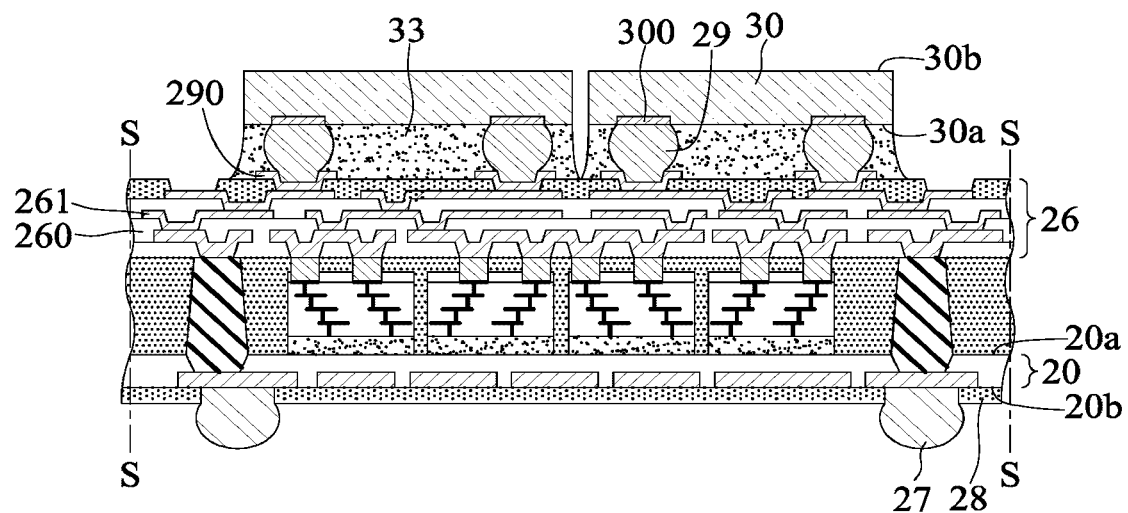
FIGS. 2F and 2G are cross-sectional views illustrating a method for manufacturing an electronic package of a first embodiment according to the present disclosure.

As shown in FIG. 2F, one or a plurality of electronic components 30 are disposed on the outermost one of the second RDLs 261 of the carrying substrate 2, to form an electronic package 3. In another embodiment, a plurality of conductive elements 27, such as solder balls, are disposed on the second side 20b of the first circuit structure 20 of the carrying substrate 2.

In an embodiment, an insulation protection layer 28, such as a solder resist layer, is formed on the second side 20b of the first circuit structure 20, and a plurality of holes are formed on the insulation protection layer 28, with the first RDLs 201 exposed from the plurality of holes, and allowing the plurality of conductive elements 27 to be bonded thereto.

In an embodiment, the electronic component 30 is an active element, such as a semiconductor chip, a passive element, such as a resistor, a capacitor or an inductor, or a combination thereof. In an embodiment, the electronic component 30 is a semiconductor chip and has an active surface 30a and an inactive surface 30b opposing the active surface 30a, electrode pads 300 on the active surface 30a are disposed in a flip-chip manner via a plurality of conductive bumps 29 made of a solder material on and electrically connected to the second RDLs 261, and an underfill 33 covers the conductive bumps 29. In another embodiment, the inactive surface 30b of the electronic component 30 is disposed on the second circuit structure 26, and a plurality of solder wires are electrically connected to the second RDL 261 in a wire bonding manner. In yet another embodiment, the electronic component 30 is electrically connected to the second RDLs 261 via a conductive material (not shown), such as conductive glue or solder. The electronic component 30 can be electrically connected to the second RDLs 261 in other manners.

An under bump metallurgy (UBM) 290 is formed on the outermost one of the second RDLs 261, for the conductive bumps 29 to be bonded thereto.

Figure 2G:
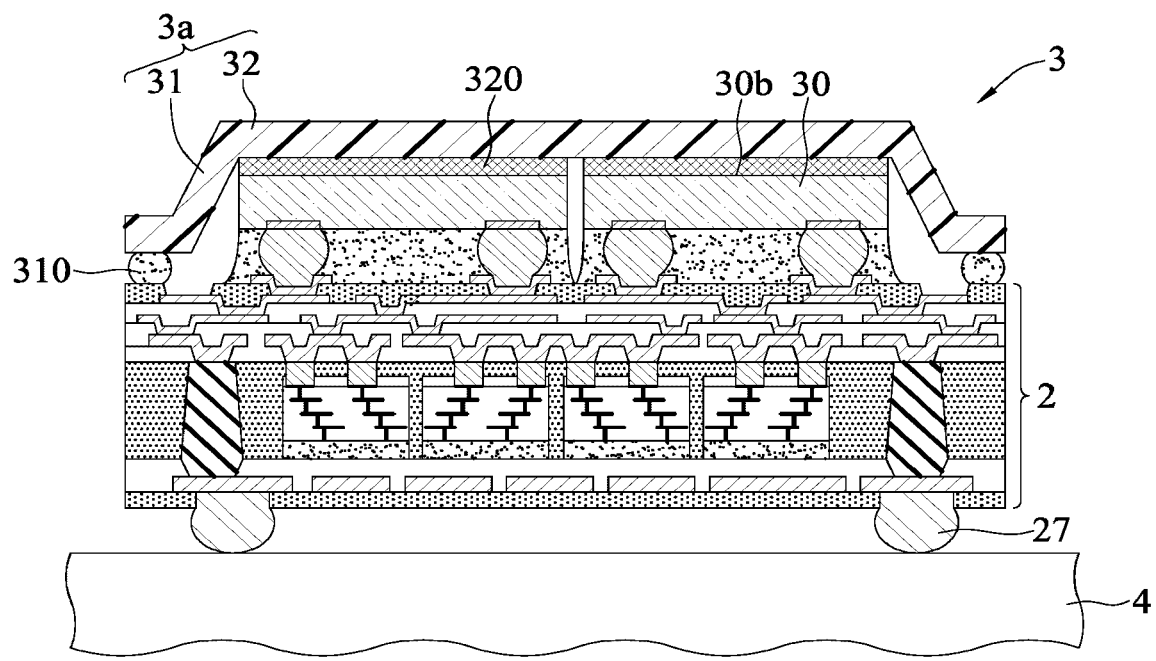

As shown in FIG. 2G, a singulation process is performed along a cutting path S shown in FIG. 2F, allowing the carrying substrate 2 to be mounted on an electronic device 4, such as a package structure or a circuit board, via the conductive elements 27 in subsequent processes.

In an embodiment, the electronic package 3 is provided with a heat sink 3a that has a supporting leg 31 bonded to the second circuit structure 26 via an adhesive layer 310 and a heat dissipator 32 bonded to the electronic component 30 via a heat conductive interface layer 320. In an embodiment, a plurality of the supporting legs 31 are integrated on the heat dissipator 32. In another embodiment, a plurality of the supporting legs 31 are bonded to the heat dissipator 32.

In an embodiment, the heat conductive interface layer 320 is formed on the heat dissipator 32 first, and then the heat dissipator 32 is bonded via the heat conductive interface layer 320 to the inactive surface 30b of the electronic component 30. In another embodiment, the adhesive layer 310 is formed on the supporting leg 31 first, and then the supporting leg 31 is bonded via the adhesive layer 310 to the second circuit structure 26.

In order to increase the bonding strength between the heat conductive interface layer 320 and the electronic component 30, gold is coated on a surface of the electronic component 30 (i.e., the so called "coating gold on chip back"). In an embodiment, a gold layer is formed on the inactive surface 30b of the electronic component 30 and a surface of the heat dissipator 32, and the heat conductive interface layer 320 is further bonded to the gold layer via a flux.

In an embodiment, the carrying substrate 2' omits the conductive pillars 23, as shown in FIG. 2G'. In a carrying substrate 2" shown in FIG. 2G", a plurality of conductive bodies 22, 22' are bonded and electrically connected to two opposing sides of the circuit component 21, with the conductive bodies 22 on one side being electrically connected to the second circuit structure 26 and the conductive bodies 22' on the other side being electrically connected to a first RDL 201' of the first circuit structure 20.

Figure 3A:
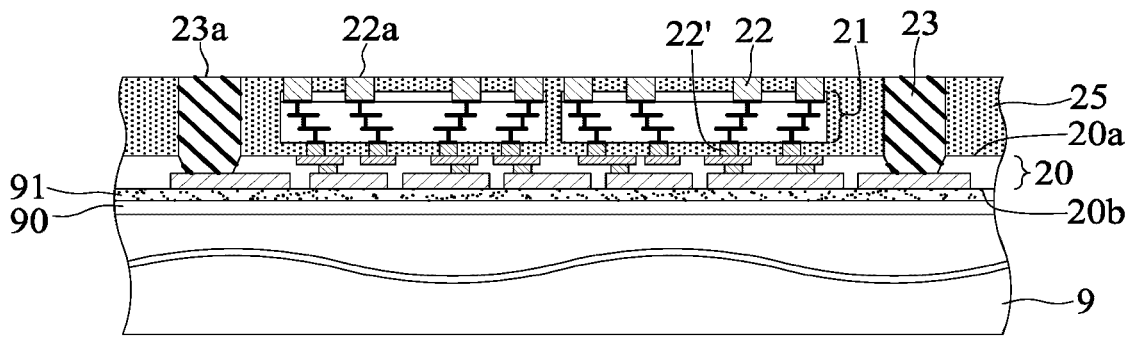
FIGS. 3A and 3B are cross-sectional views illustrating a method for manufacturing a carrying substrate of a second embodiment according to the present disclosure.
Figure 3B:
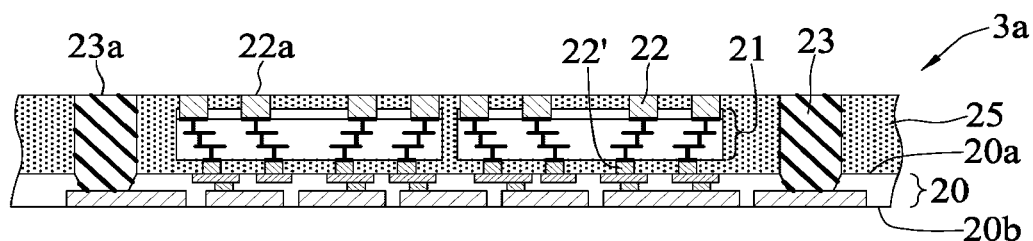

FIGS. 3A and 3B are cross-sectional views illustrating a method for manufacturing a carrying substrate 3a of a second embodiment according to the present disclosure. The second embodiment differs from the first embodiment in that the second circuit structure is omitted.

As shown in FIG. 3A, the circuit component 21 shown in FIG. 2G" is used to conduct the manufacturing process shown in FIGS. 2A to 2C. A plurality of circuit components 21 are provided, each of which has a plurality of conductive bodies 22, 22' bonded and electrically connected to two opposing sides thereof; The plurality of circuit components 21 and a plurality of conductive pillars 23 are electrically connected to a first circuit structure 20 disposed on a carrying board 9; an encapsulation layer 25 is formed and a leveling process is performed.

As shown in FIG. 3B, the carrying board 9 and the release layer 90 and the adhesive layer 91 thereon are removed, to expose the second side 20b of the first circuit structure 20, and to form the carrying substrate 3a according to the present disclosure.

In the method for manufacturing the carrying substrate 3a according to the present disclosure, the circuit component 21 is embedded in the encapsulation layer 25 by an existing packaging process, to increase the routing area. Compared with the prior art, the method for manufacturing the carrying substrate 3a according to the present disclosure increases the yield, satisfies the demand for package substrates of a large size, has very low manufacturing cost and is very competitive in the market.

The first circuit structure 20 is used for allocating the number of routing layers of the circuit component 21, to reduce the number of the routing layers of the circuit component 21 and increase the manufacturing yield of the circuit component 21.

Figure 3C:
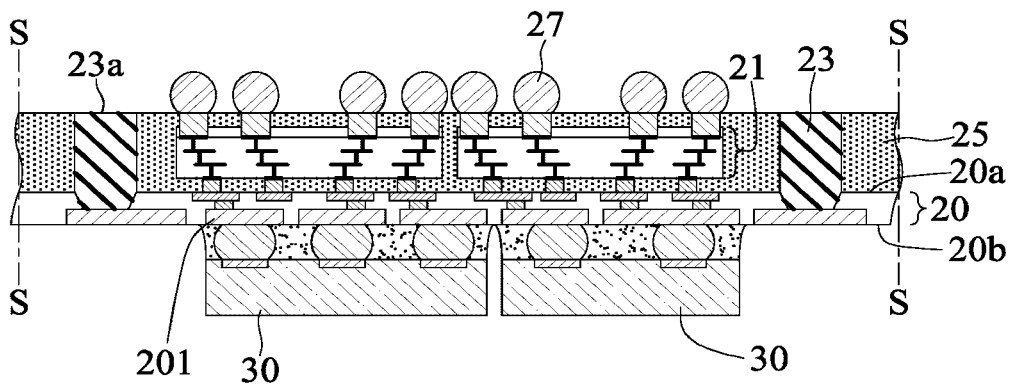
FIGS. 3C and 3D are cross-sectional views illustrating a method for manufacturing an electronic package of the second embodiment according to the present disclosure.

As shown in FIG. 3C, one or more circuit components 30 can be disposed on the first RDL 201 on the second side 20b of the first circuit structure 20, and the carrying substrate 3a can be bonded to a plurality of conductive elements 27, such as solder balls, disposed on the circuit component 21 via the conductive bodies 22, to allow the carrying substrate 3a to be mounted on an electronic device 4 shown in FIG. 2G via the conductive elements 27 in a subsequent process.

Figure 3D:
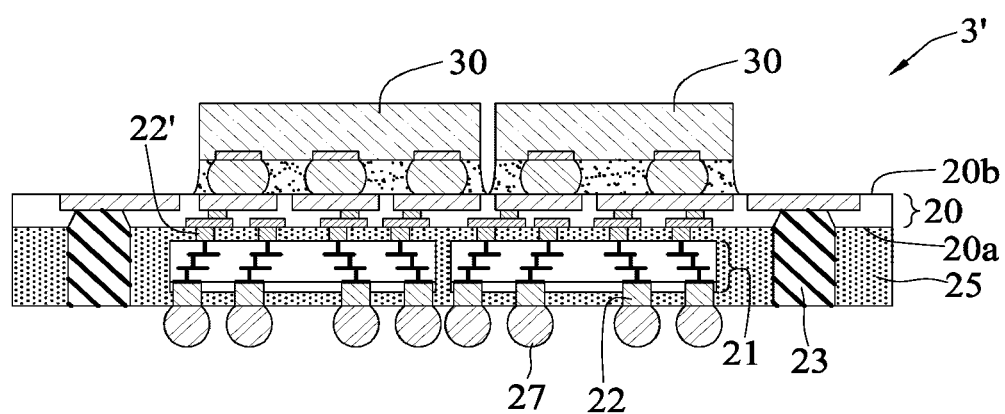

As shown in FIG. 3D, a singulation process is performed along a cutting path S shown in FIG. 3C, to obtain the electronic packages 3'.

The present disclosure also provides an electronic package 3, 3', which comprises a carrying substrate 2, 2', 2", 3a and at least one electronic component 30 disposed on a side of the carrying substrate 2, 2', 2", 3a. The carrying substrate 2, 2', 2", 3a comprises a first circuit structure 20, a circuit component 21, and an encapsulation layer 25.

The first circuit structure 20 has a first side 20a and a second side 20b opposing the first side 20a. In an embodiment, a plurality of conductive pillars 23 are disposed on the first side 20a and electrically connected to the first circuit structure 20 on demand.

The circuit component 21 is disposed on the first side 20a of the first circuit structure 20, and a plurality of conductive bodies 22, 22' are bonded and electrically connected to the circuit component 21.

The encapsulation layer 25 is formed on the first side 20a of the first circuit structure 20 and encapsulates the circuit component 21, the conductive bodies 22, 22' and the conductive pillars 23, with the end surface 23a of the conductive pillars 23 and the end surface 22a of the conductive bodies 22 exposed from the encapsulation layer 25.

In an embodiment, the circuit component 21 is electrically connected via a plurality of conductive bodies 22' to the first circuit structure 20.

In an embodiment, the carrying substrate 3, 3' further comprises a plurality of conductive elements 27 disposed on the other side of the carrying substrate 2, 2', 2", 3a.

In an embodiment, the carrying substrate 2, 2', 2" further comprises: a second circuit structure 26 disposed on the encapsulation layer 25, electrically connected to the conductive pillars 23, and electrically connected to the circuit component 21 via the conductive bodies 22; and a plurality of conductive bumps 29 disposed on the second circuit structure 26.

In an embodiment, the electronic component 30 is an active element, a passive element, or a combination thereof.

In an embodiment, the electronic package 3 further comprises a heat sink 3a disposed on the second circuit structure 26. In another embodiment, the heat sink 3a is in contact with the electronic component 30.

In the electronic package, the carrying substrate and the methods for manufacturing the same according to the present disclosure, the circuit component is disposed on the first circuit structure and embedded in the encapsulation layer via an existing packaging process. Therefore, the routing area is increased. Compared with the prior art, the carrying substrate according to the present disclosure has a high yield and low manufacturing cost, which is beneficial for demands of the package substrate of large size and market competitiveness.

The circuit structures are used for allocating the number of routing layers of the circuit component, to reduce the number of the routing layers of the circuit component and increase the manufacturing yield of the circuit component.

The foregoing descriptions of the detailed embodiments are only illustrated to disclose the features and functions of the present disclosure and not restrictive of the scope of the present disclosure. It should be understood to those in the art that all modifications and variations according to the spirit and principle in the disclosure of the present disclosure should fall within the scope of the appended claims.

What is claimed is:

1. A carrying substrate, comprising:
   a first circuit structure having a first side and a second side opposing the first side;
   at least four circuit components disposed on the first side of the first circuit structure;
   an encapsulation layer formed on the first side of the first circuit structure and encapsulating the at least four circuit components;
   a second circuit structure formed on the encapsulation layer and electrically connected to the at least four circuit components; and
   a plurality of conductive pillars disposed in the encapsulation layer and electrically connecting the first circuit structure and the second circuit structure.

2. The carrying substrate of claim 1, further comprising a plurality of conductive bodies, wherein the at least four circuit components are electrically connected to the second circuit structure via the plurality of conductive bodies.

3. The carrying substrate of claim 1, further comprising a plurality of conductive bumps disposed on the second circuit structure.

4. The carrying substrate of claim 1, wherein each of the at least four circuit components is a package substrate.

5. The carrying substrate of claim 1, wherein each of the at least four circuit components is a coreless circuit structure.

6. The carrying substrate of claim 1, wherein each of the at least four circuit components has a through silicon via structure.

7. The carrying substrate of claim 1, wherein the at least four circuit components are electrically connected to the first circuit structure via a plurality of conductive bodies.

8. An electronic package, comprising:
   the carrying substrate of claim 1; and
   at least one electronic component disposed on one of a first side and a second side of the carrying substrate.

9. The electronic package of claim 8, wherein the electronic component is an active element, a passive element, or a combination thereof.

10. The electronic package of claim 8, further comprising a plurality of conductive elements disposed on other one of the first side and the second side of the carrying substrate without the electronic component.

11. The electronic package of claim 8, further comprising a heat sink disposed on the carrying substrate.

12. The electronic package of claim 11, wherein the heat sink is in contact with the electronic component.

\* \* \* \* \*